(12) United States Patent
Lai et al.

(10) Patent No.: US 12,255,078 B2
(45) Date of Patent: Mar. 18, 2025

(54) SEMICONDUCTOR DEVICES AND METHODS OF MANUFACTURING

(71) Applicant: Taiwan Semiconductor Manufacturing Co., Ltd., Hsinchu (TW)

(72) Inventors: Po-Chen Lai, Hsinchu (TW); Ming-Chih Yew, Hsinchu (TW); Po-Yao Lin, Zhudong Township (TW); Chien-Sheng Chen, Hsinchu (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,443

(22) Filed: Aug. 10, 2023

(65) Prior Publication Data
US 2023/0386863 A1    Nov. 30, 2023

Related U.S. Application Data

(62) Division of application No. 17/346,972, filed on Jun. 14, 2021, now Pat. No. 11,854,837.

(60) Provisional application No. 63/178,094, filed on Apr. 22, 2021.

(51) Int. Cl.
*H01L 21/00* (2006.01)
*H01L 21/56* (2006.01)
*H01L 23/31* (2006.01)

(52) U.S. Cl.
CPC ............ *H01L 21/56* (2013.01); *H01L 23/315* (2013.01)

(58) Field of Classification Search
None
See application file for complete search history.

(56) References Cited

U.S. PATENT DOCUMENTS

| | | | |
|---|---|---|---|
| 11,121,089 B2 | 9/2021 | Yu et al. | |
| 11,315,802 B2* | 4/2022 | Kim | ........................ H01L 24/14 |
| 2009/0001612 A1 | 1/2009 | Song et al. | |
| 2011/0241222 A1 | 10/2011 | Sezi et al. | |
| 2011/0254156 A1* | 10/2011 | Lin | .................... H01L 21/6835 |
| | | | 257/737 |
| 2014/0027929 A1 | 1/2014 | Lin et al. | |
| 2014/0217521 A1 | 8/2014 | Johari-Galle et al. | |
| 2018/0006192 A1* | 1/2018 | Rudmann | ......... H01L 31/02325 |
| 2018/0053753 A1 | 2/2018 | Singh et al. | |
| 2020/0350180 A1 | 11/2020 | Yen et al. | |

FOREIGN PATENT DOCUMENTS

TW        202038343 A        10/2020

* cited by examiner

*Primary Examiner* — Nicholas J Tobergte
(74) *Attorney, Agent, or Firm* — Slater Matsil, LLP

(57) ABSTRACT

Semiconductor devices and methods of manufactured are presented in which a first redistribution structure is formed, semiconductor devices are bonded to the first redistribution structure, and the semiconductor devices are encapsulated in an encapsulant. First openings are formed within the encapsulant, such as along corners of the encapsulant, in order to help relieve stress and reduce cracks.

20 Claims, 17 Drawing Sheets

SEMICONDUCTOR DEVICES AND METHODS OF MANUFACTURING

PRIORITY CLAIM AND CROSS-REFERENCE

This application is a divisional of U.S. patent application Ser. No. 17/346,972, filed on Jun. 14, 2021, entitled "Semiconductor Devices and Methods of Manufacturing," which claims the benefit of U.S. Provisional Application No. 63/178,094, filed on Apr. 22, 2021, which applications are hereby incorporated herein by reference.

BACKGROUND

As semiconductor integrated circuits become smaller and smaller in two dimensions, increased attention has been focused on connecting multiple functional dies together through the use of interposers. One particular embodiment includes a system such as a chip-on-wafer-on-substrate (CoWoS) system, in which dies are attached to a wafer and then attached to a substrate. However, as devices get smaller and smaller, additional problems need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
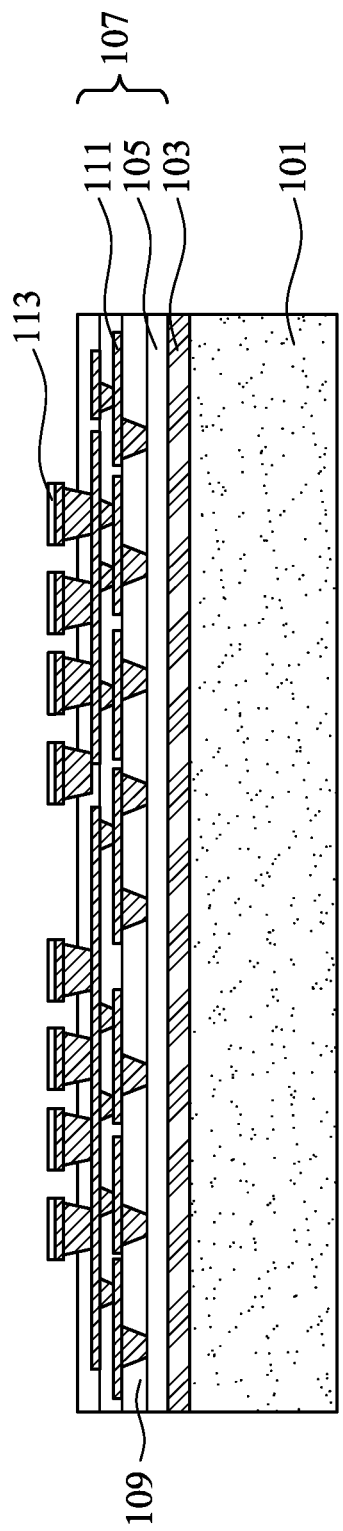
FIG. 1 illustrates formation of a first redistribution structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to system on chip on wafer (SoCoW) devices in a fan-out package which utilize first openings in order to help reduce or eliminate the occurrence of cracks within an encapsulant. However, the embodiments described are not intended to limit the embodiments, as the ideas presented may be included in a wide range of embodiments, including any suitable technology generation, all of which are fully intended to be included within the scope.

With reference now to FIG. 1, there is shown a first carrier substrate 101 with an overlying polymer layer 105. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor die 201 and a second semiconductor die 203 (not illustrated in FIG. 1 but illustrated and discussed below with respect to FIG. 2).

An optional first adhesive layer 103 is placed on the first carrier substrate 101 in order to assist in the adherence of overlying structures (e.g., the polymer layer 105). In an embodiment the first adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The first adhesive layer 103 may be placed onto the first carrier substrate 101 in a semi-liquid or gel form, which is readily deformable under pressure.

The polymer layer 105 is placed over the first adhesive layer 103 and is utilized in order to provide protection to, e.g., a first redistribution structure 107 once the first redistribution structure 107 has been formed. In an embodiment the polymer layer 105 may be polybenzoxazole (PBO), although any suitable material, such as polyimide or a polyimide derivative, Solder Resistance (SR), or Ajinomoto build-up film (ABF) may be utilized. The polymer layer 105 may be placed using, e.g., a spin-coating process to a thickness of between about 2 µm and about 15 µm, such as about 5 µm, although any suitable method and thickness may be used.

Once the polymer layer 105 has been formed, the first redistribution structure 107 (e.g., an organic interposer) may be formed over the polymer layer 105 in, e.g., an RDL-first technology. In an embodiment the first redistribution structure 107 comprises a series of conductive layers 111 (such as three conductive layers) embedded within a series of dielectric layers 109 (such as three dielectric layers). In an embodiment, a first one of the series of dielectric layers 109 is formed over the polymer layer 105, and the first one of the series of dielectric layers 109 may be a material such as polybenzoxazole (PBO), although any suitable material, such as polyimide or a polyimide derivative, may be utilized. The first one of the series of dielectric layers 109 may be placed using, e.g., a spin-coating process, although any suitable method may be used.

After the first one of the series of dielectric layers 109 has been formed, openings may be made through the first one of the series of dielectric layers 109 by removing portions of the first one of the series of dielectric layers 109. The openings may be formed using a suitable photolithographic mask and etching process, although any suitable process or processes may be used to pattern the first one of the series of dielectric layers 109. In some embodiments the photolithographic masking and etching process of the first one of the series of dielectric layers 109 may utilize multiple exposures of patterned energy through a reticle, as the first one of the series of dielectric layers 109 is larger than a single image through the reticle will expose.

Once the first one of the series of dielectric layers 109 has been formed and patterned, a first one of the series of conductive layers 111 is formed over the first one of the series of dielectric layers 109 and through the openings formed within the first one of the series of dielectric layers 109. In an embodiment the first one of the series of conductive layers 111 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers 111 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers 111. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 111 has been formed, a second one of the series of dielectric layers 109 and a second one of the series of conductive layers 111 may be formed by repeating steps similar to the first one of the series of dielectric layers 109 and the first one of the series of conductive layers 111. These steps may be repeated as desired in order to electrically connect each of the series of conductive layers 111 to an underlying one of the series of conductive layers 111, and may be repeated as often as desired until an uppermost one of the series of conductive layers 111 and an uppermost one of the series of dielectric layers 109 has been formed. In an embodiment the deposition and patterning of the series of conductive layers 111 and the series of dielectric layers 109 may be continued until the first redistribution structure 107 has a desired number of layers, such as three layers, although any suitable number of individual layers may be utilized.

Once the series of conductive layers 11 and the series of dielectric layers 109 have been finished, first conductive connectors 113 may be formed. In an embodiment the first conductive connectors 113 may be microbumps, ball grid array (BGA) connectors, solder balls, metal pillars, controlled collapse chip connection (C4) bumps, electroless nickel-electroless palladium-immersion gold technique (ENEPIG) formed bumps, or the like. The first conductive connectors 113 may include a conductive material such as solder, copper, aluminum, gold, nickel, silver, palladium, tin, the like, or a combination thereof. In some embodiments, the first conductive connectors 113 are formed by initially forming a layer of solder through evaporation, electroplating, printing, solder transfer, ball placement, or the like. Once a layer of solder has been formed on the structure, a reflow may be performed in order to shape the material into the desired bump shapes.

In another embodiment, the first conductive connectors 113 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 2:
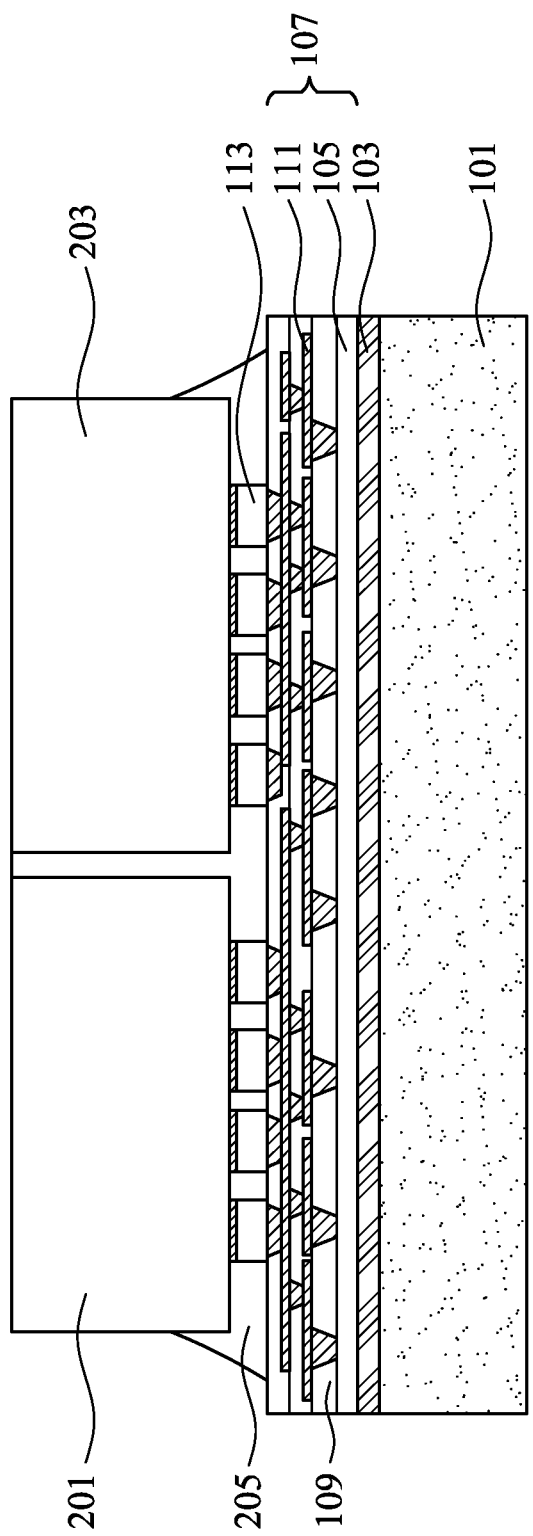
FIG. 2 illustrates a bonding of a first semiconductor die and a second semiconductor die, in accordance with some embodiments.

FIG. 2 illustrates a placement of the first semiconductor die 201 and the second semiconductor die 203. In an embodiment the first semiconductor die 201 and the second semiconductor die 203 may be semiconductor devices such as system on chip dies, logic dies, DRAM dies, SRAM dies, central processing unit dies, I/O dies, combinations of these, or the like. Additionally, while the first semiconductor die 201 and the second semiconductor die 203 may be the same type of device (e.g., are homogenous components such as both being SoC devices or DRAM dies), they may also be different types of dies (e.g., are heterogenous components where one may be a logic die or a SoC die and another may be a DRAM die such as a high bandwidth memory (HBM) die). The semiconductor dies may also comprise a stack of multiple dies. Any suitable combination of semiconductor dies, and any number of semiconductor dies, may be utilized, and all such numbers, combinations, and functionalities are fully intended to be included within the scope of the embodiments.

In an embodiment the first semiconductor die 201 and the second semiconductor die 203 may be placed onto the first conductive connectors 113 using, e.g., a pick and place process. Once the first semiconductor die 201 and the second semiconductor die 203 have been placed, a bonding is performed. For example, in an embodiment in which the first conductive connectors 113 are microbumps, the bonding process may comprise a reflow process whereby the temperature of the first conductive connectors 113 is raised to a point where the first conductive connectors 113 will liquefy and flow, thereby bonding the first semiconductor die 201 and the second semiconductor die 203 to the first redistribution structure 107 once the first conductive connectors 113 resolidify. However, any other method of placing the first semiconductor die 201 and the second semiconductor die 203 may be used.

Once bonded, a first underfill 205 may be placed between the first semiconductor die 201, the second semiconductor die 203, and the first redistribution structure 107. In an embodiment the first underfill 205 is a protective material used to cushion and support the first semiconductor die 201, the second semiconductor die 203, and the first redistribution structure 107 from operational and environmental degradation, such as stresses caused by the generation of heat during operation. The first underfill 205 may be placed using an injection process with capillary action or may be otherwise formed in the space between the first semiconductor die 201, the second semiconductor die 203, and the first redistribution structure 107 and may, for example, comprise a liquid epoxy that is dispensed between the first semiconductor die 201, the second semiconductor die 203, and the first redistribution structure 107 and then cured to harden.

Figure 3:
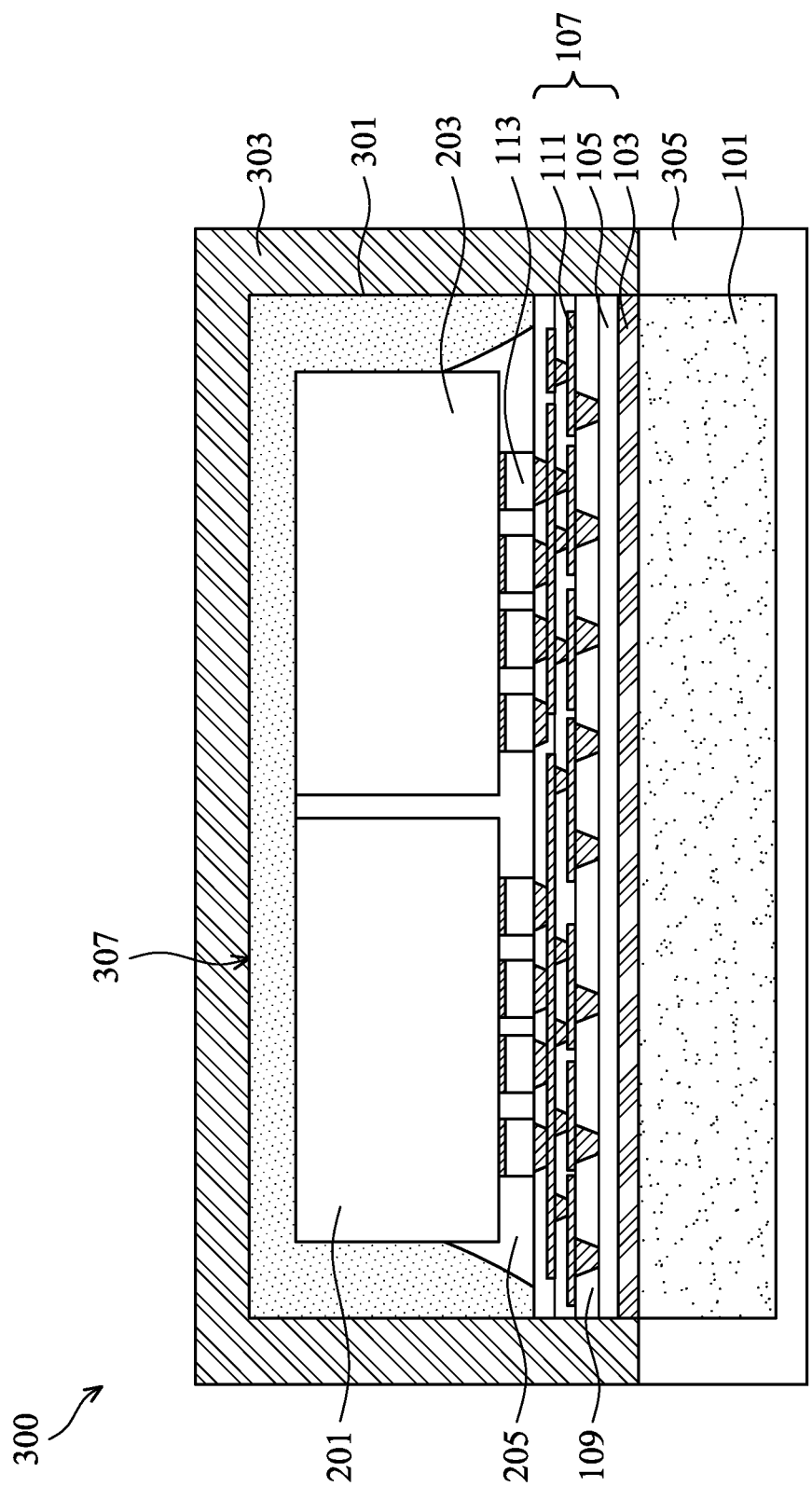
FIG. 3 illustrates an encapsulation of the first semiconductor die and the second semiconductor die, in accordance with some embodiments.

FIG. 3 illustrates that, once the first underfill 205 has been placed, an encapsulant 301 may be used to encapsulate the first semiconductor die 201 and the second semiconductor die 203. In an embodiment the encapsulant 301 may be placed using a molding device 300 with, e.g., a top molding portion 303 and a bottom molding portion 305 separable from the top molding portion 303. When the top molding portion 303 is lowered to be adjacent to the bottom molding portion 305, a molding cavity 307 for the first semiconductor die 201 and the second semiconductor die 203 is formed. Accordingly, while the shape of the molding cavity 307 will be influenced by the size and shape of the first semiconductor die 201 and the second semiconductor die 203, as an example only, the molding cavity 307 may have a first diameter sufficient to house the first semiconductor die 201 and the second semiconductor die 203 and to form the dimensions of the encapsulant 301. However, any suitable dimensions may be used.

The sidewalls of the molding cavity 307 may be coated with a release material (not separately illustrated in FIG. 3). This release material is intended to provide a non-adhering surface for the encapsulant 301, so that, once the first semiconductor die 201 and the second semiconductor die 203 are encapsulated, the first semiconductor die 201 and the second semiconductor die 203 can be easily removed from the molding cavity 307 without adhering to the sidewalls of the molding cavity 307. The release material may be, for example, gold, Teflon, Cr—N, combinations of these, or the like, although any suitable release material may be utilized.

Optionally, a separate release film (not separately illustrated in FIG. 3) may be positioned to be located between the top molding portion 303 and the first semiconductor die 201 and the second semiconductor die 203. The release film may be a material that allows the encapsulant to not stick, or be released from, the surfaces once the first semiconductor die 201 and the second semiconductor die 203 have gone through the encapsulating process. The release film may comprise polyimide, vinyl chloride, PC, ETFE, PTFE, PET, FEP, polyvinylidene chloride, fluorine-containing glass cloth, synthetic paper, metallic foil, combinations of these, and the like.

To place the encapsulant 301, the first semiconductor die 201 and the second semiconductor die 203 may first be placed into the molding cavity 307. Once in place, the top molding portion 303 is positioned adjacent to the bottom molding portion 305, thereby enclosing the first semiconductor die 201 and the second semiconductor die 203 within the molding cavity 307. Once enclosed, the top molding portion 303 and the bottom molding portion 305 (along with the release film sandwiched between them) may form an airtight seal in order to control the influx and outflux of gasses from the molding cavity 307. The top molding portion 303 and the bottom molding portion 305 may be pressed together using, e.g., a compression tool and a force of between about 5 KN and about 200 KN, such as between about 50 and 100 KN.

Once the first semiconductor die 201 and the second semiconductor die 203 have been enclosed, the encapsulant 301 is placed within the molding cavity 307. The encapsulant 301 may be a resin such as polyimide, PPS, PEEK, PES, a heat resistant crystal resin, combinations of these, or the like. The encapsulant 301 may be placed within the molding cavity 307 prior to the alignment of the top molding portion 303 and the bottom molding portion 305, or else may be injected into the molding cavity 307 through an injection port (not shown).

Once the encapsulant 301 has been placed into the molding cavity 307 such that the encapsulant 301 encapsulates the first semiconductor die 201 and the second semiconductor die 203, the encapsulant 301 may be cured in order to harden the encapsulant 301 for optimum protection. While the exact curing process is dependent at least in part on the particular material chosen for the encapsulant 301, in an embodiment in which molding compound is chosen as the encapsulant 301, the curing could occur through a process such as heating the encapsulant 301 to between about 100° C. and about 130° C., such as about 125° C. for about 60 sec to about 3000 sec, such as about 600 sec. Additionally, initiators and/or catalysts may be included within the encapsulant 301 to better control the curing process.

However, as one having ordinary skill in the art will recognize, the curing process described above is merely an exemplary process and is not meant to limit the current embodiments. Other curing process, such as irradiation or even allowing the encapsulant 301 to harden at ambient temperature, may be used. Any suitable curing process may be used, and all such processes are fully intended to be included within the scope of the embodiments discussed herein.

Figure 4:
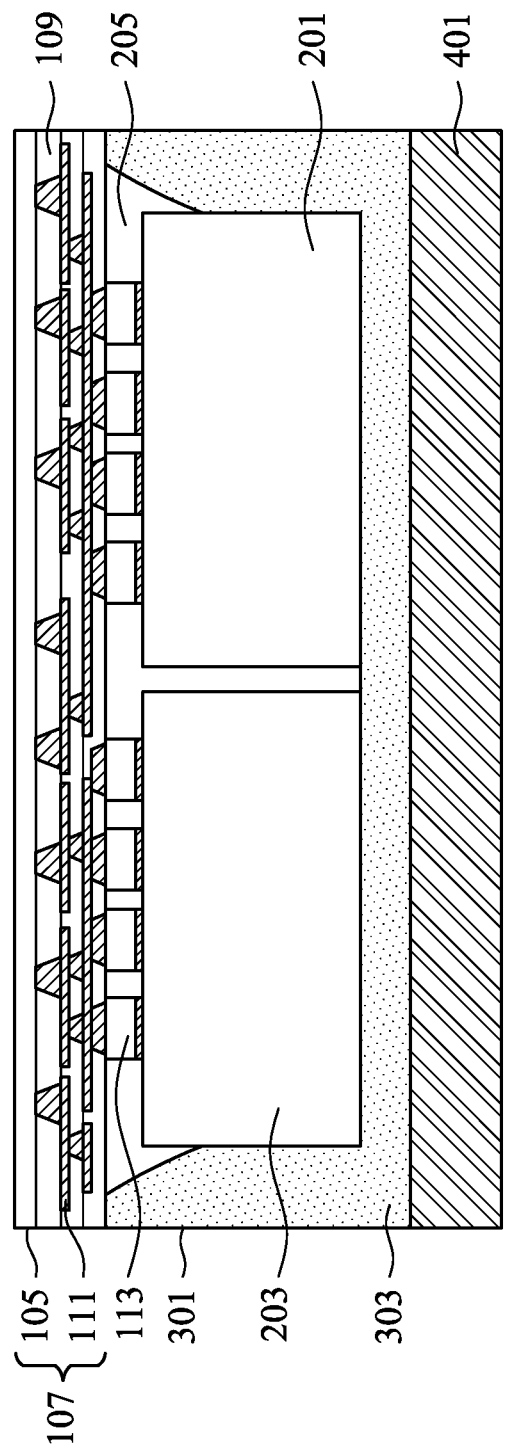
FIG. 4 illustrates a bonding of a carrier, in accordance with some embodiments.

FIG. 4 illustrates that, once the encapsulant 301 has been placed and cured, the structure may be transferred to a second carrier substrate 401 and the first carrier substrate 101 may be removed. In an embodiment the encapsulant 301 may be attached to the second carrier substrate 401 using, e.g., a second adhesive layer (not separately illustrated in FIG. 4). The second carrier substrate 401 and the second adhesive layer may be similar to the first carrier substrate 101 and the first adhesive layer 103 (described above with respect to FIG. 1), although any suitable structures and any suitable adhesives may be utilized.

Additionally, once the encapsulant 301 has been attached to the second carrier substrate 401, the first carrier substrate 101 may be removed. In an embodiment the first carrier substrate 101 may be debonded using, e.g., a thermal process to alter the adhesive properties of the first adhesive layer 103. In a particular embodiment an energy source such as an ultraviolet (UV) laser, a carbon dioxide ($CO_2$) laser, or an infrared (IR) laser, is utilized to irradiate and heat the first adhesive layer 103 until the first adhesive layer 103 loses at least some of its adhesive properties. Once performed, the first carrier substrate 101 and the first adhesive layer 103 may be physically separated and removed from the structure.

Figure 5:
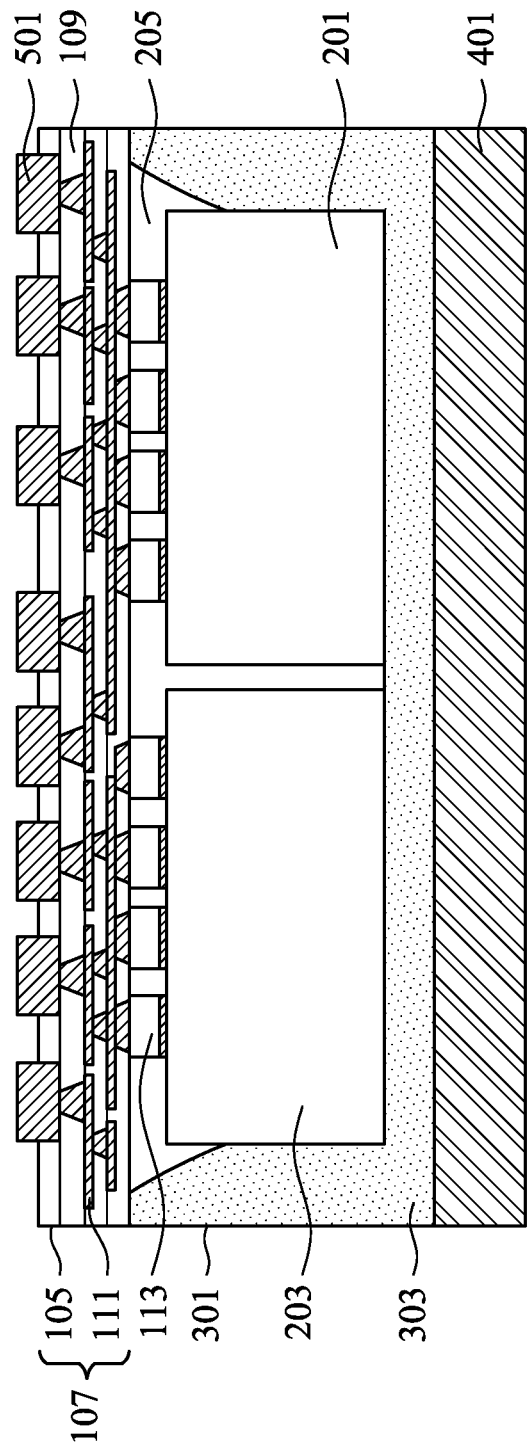
FIG. 5 illustrates formation of conductive connectors, in accordance with some embodiments.

FIG. 5 illustrates formation of second conductive connectors 501 through the polymer layer 105 and in electrical connection with the first redistribution structure 107. To initiate the formation of the second conductive connectors 501, the polymer layer 105 is patterned to expose portions of the first redistribution structure 107 using, e.g., a laser drilling method. In such a method a protective layer, such as a light-to-heat conversion (LTHC) layer or a hogomax layer (not separately illustrated in FIG. 5) is first deposited over the polymer layer 105. Once protected, a laser is directed towards those portions of the polymer layer 105 which are desired to be removed in order to expose the underlying first redistribution structure 107. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form openings over the first redistribution structure 107 to have a width of between about 100 μm and about 300 μm, such as about 200 μm.

In another embodiment, the polymer layer 105 may be patterned by initially applying a photoresist (not individually illustrated in FIG. 5) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Once the underlying polymer layer 105 has been exposed, the second conductive connectors 501 may be formed. In an embodiment the second conductive connectors 501 may be controlled collapse chip connection (C4) bumps, microbumps, ball grid array (BGA) connectors, solder balls, metal pillars, electroless nickel-electroless palladium-immersion gold technique (ENEPIG) formed bumps, or the like. The second conductive connectors 501 may include a conductive material such as solder, copper, aluminum, gold, nickel, silver, palladium, tin, the like, or a combination thereof. In some embodiments, the second conductive connectors 501 are formed by initially forming a layer of solder through evaporation, electroplating, printing, solder transfer, ball placement, or the like. Once a layer of solder has been formed on the structure, a reflow may be performed in order to shape the material into the desired bump shapes.

In another embodiment, the second conductive connectors 501 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 6:
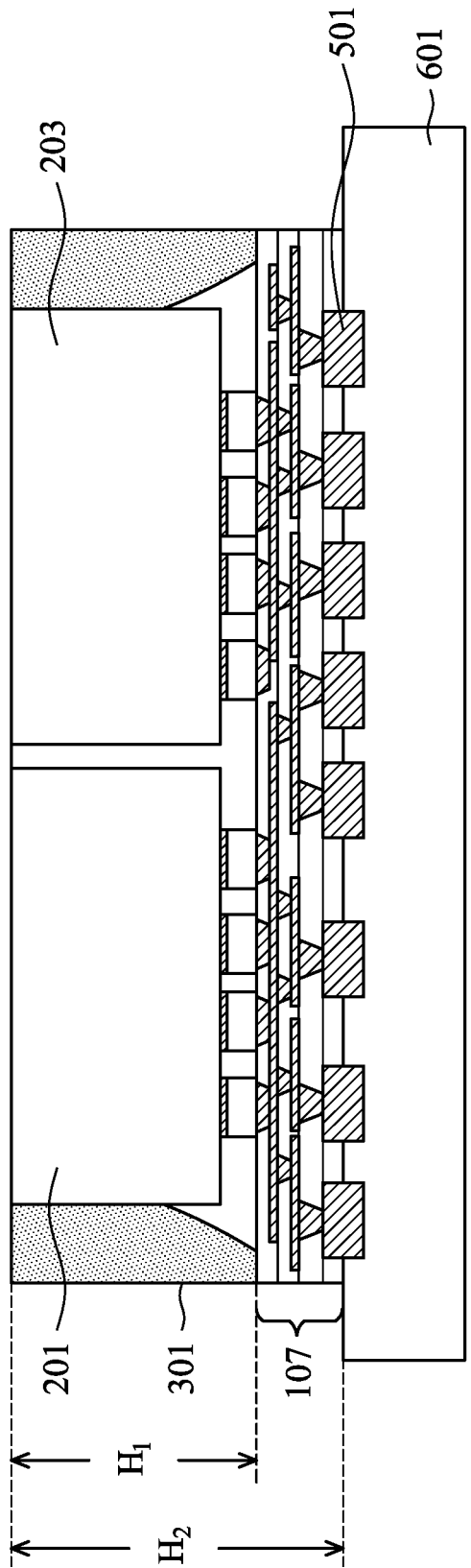
FIG. 6 illustrates a planarization process, in accordance with some embodiments.

FIG. 6 illustrates a debonding of the second carrier substrate 401. In an embodiment the second conductive connectors 501 and, hence, the structure including the first semiconductor die 201 and the second semiconductor die 203, may be attached to an ultraviolet tape 601 and a ring structure (not separately illustrated in FIG. 6). The ring structure may be a metal ring intended to provide support and stability for the structure during and after the debonding process. In an embodiment the second conductive connectors 501 are attached to the ring structure using, e.g., the ultraviolet tape 601, although any other suitable adhesive or attachment may be used.

Once the second conductive connectors 501 and, hence, the structure including the first semiconductor die 201 and the second semiconductor die 203 are attached to the ring structure, the second carrier substrate 401 may be debonded from the structure including the first semiconductor die 201 and the second semiconductor die 203 using, e.g., a thermal process to alter the adhesive properties of the second adhesive layer. In a particular embodiment an energy source such as an ultraviolet (UV) laser, a carbon dioxide ($CO_2$) laser, or an infrared (IR) laser, is utilized to irradiate and heat the second adhesive layer until the second adhesive layer loses at least some of its adhesive properties. Once performed, the second carrier substrate 401 and the second adhesive layer may be physically separated and removed from the structure comprising the second conductive connectors 501, the first semiconductor die 201, and the second semiconductor die 203.

However, while a ring structure may be used to support the second conductive connectors 501, such a description is merely one method that may be used and is not intended to be limiting upon the embodiments. In another embodiment the second conductive connectors 501 may be attached to a third carrier substrate using, e.g., a first glue. In an embodiment the third carrier substrate is similar to the first carrier substrate 101, although it may also be different. Once attached, the second adhesive layer may be irradiated and the second adhesive layer and the second carrier substrate 401 may be physically removed.

Once the second conductive connectors 501 have been attached, the encapsulant 301 may optionally be thinned in order to expose the first semiconductor die 201 and the second semiconductor die 203. In an embodiment the encapsulant 301 may be thinned using a chemical mechanical polishing (CMP) process until the encapsulant 301, the first semiconductor die 201, and the second semiconductor die 203 are planar with each other. In an embodiment the encapsulant 301 may be thinned until the encapsulant 301 has a first height $H_1$ of between about 150 μm and about 700 μm, and the overall structure has a second height H2 of between about 300 μm and about 850 μm. However, any suitable thinning process, such as a grinding process or even one or more etch back processes, and any suitable height, may also be utilized.

Figure 7A:
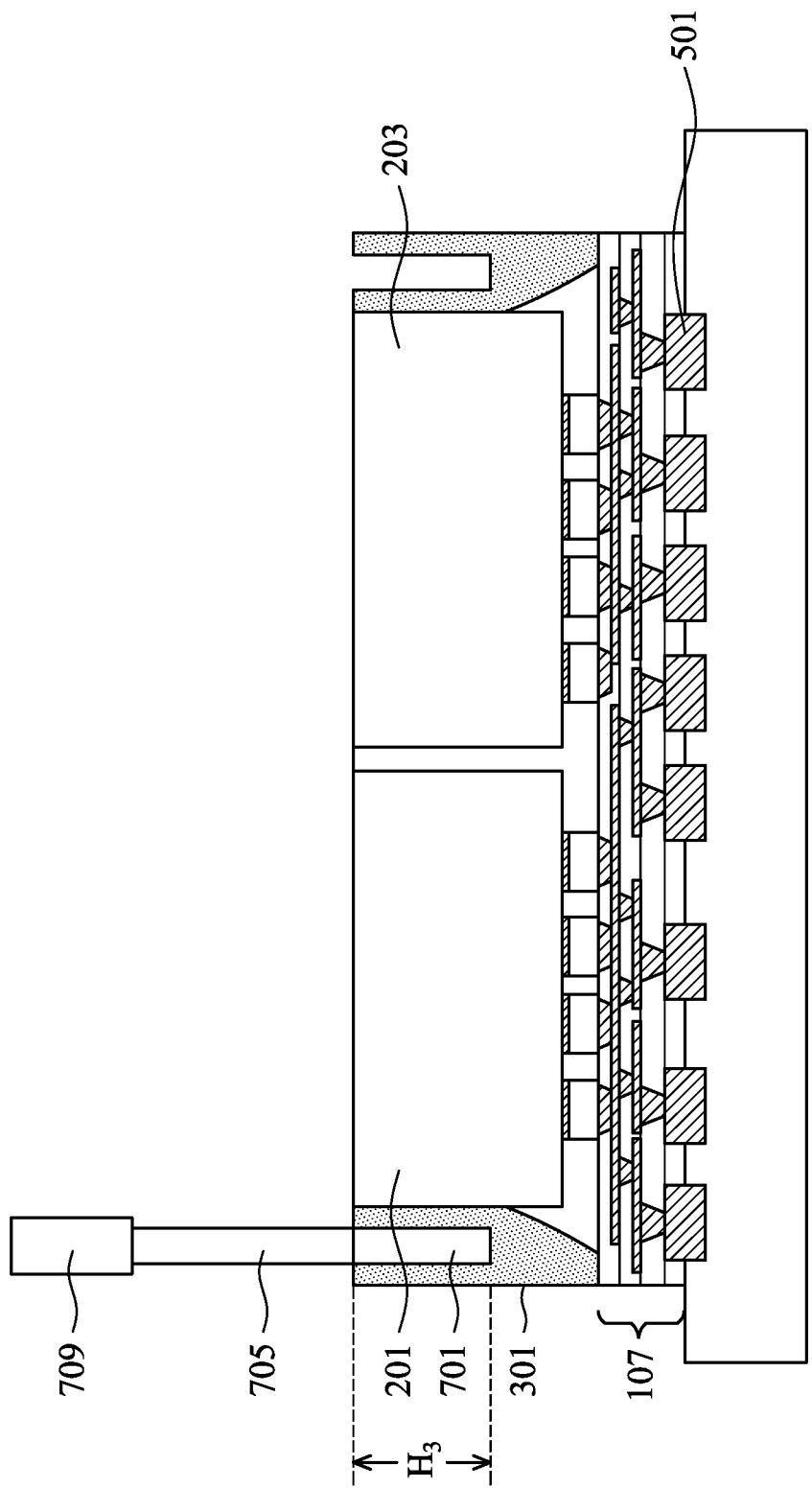
FIGS. 7A-7C illustrate formation of first openings, in accordance with some embodiments.
Figure 7B:
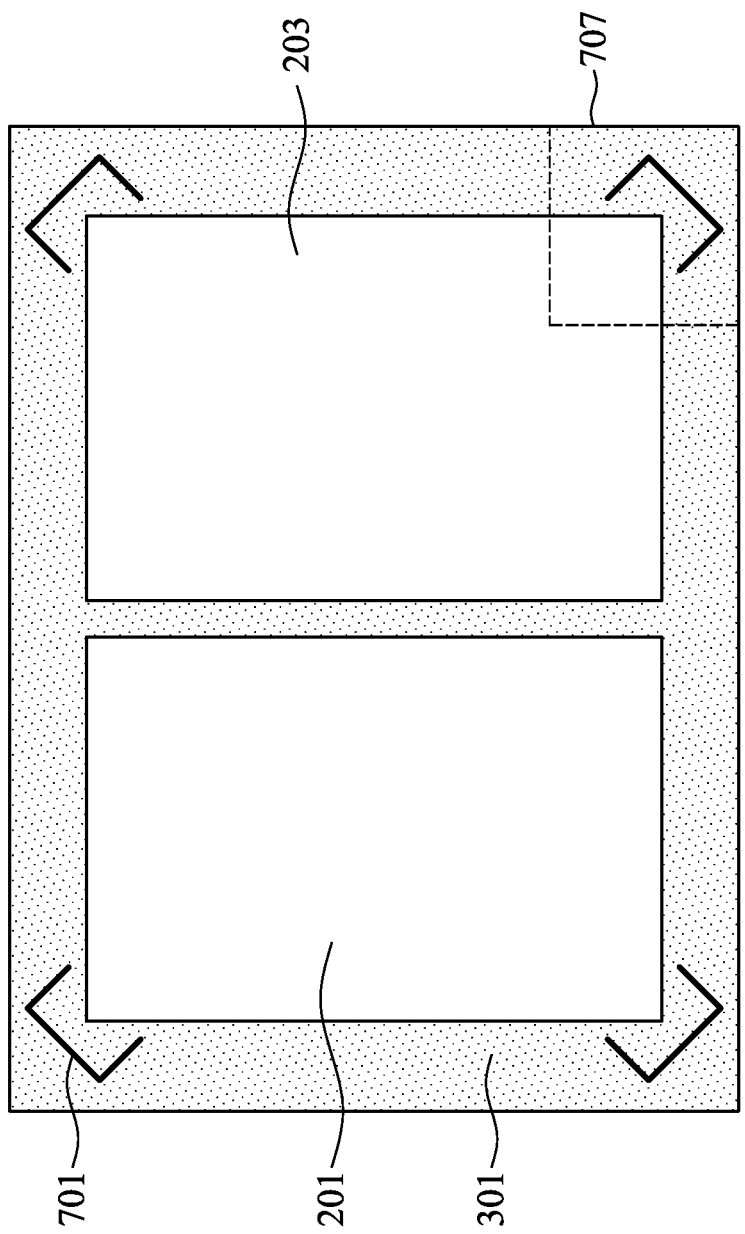
Figure 7C:
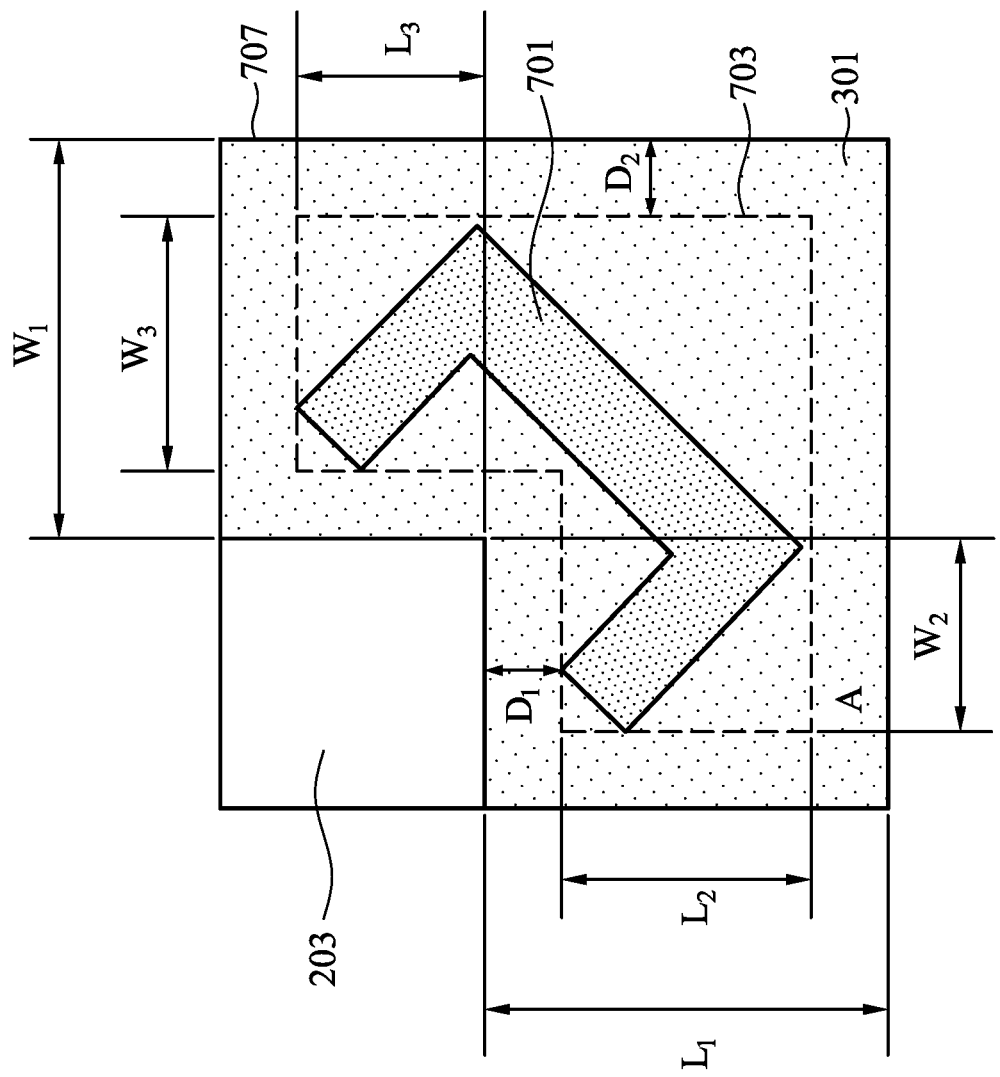

FIGS. 7A-7C illustrate a formation of first openings 701 within the encapsulant 301 between the semiconductor dies and sidewalls of the encapsulant 301. In an embodiment the first openings 701 are formed using a laser drilling method. In such a method a laser 709 generates a laser beam 705 and directs the laser beam 705 towards those portions of the encapsulant 301 which are desired to be removed. During the laser drilling process the drill energy may be in a range from 1 mJ to about 10 mJ, and a drill angle of about 0 degree (perpendicular to the encapsulant 301) to about 85 degrees to normal of the encapsulant 301.

In another embodiment, the encapsulant 301 may be patterned by initially applying a photoresist (not individually illustrated in FIG. 7A) to the encapsulant 301 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the encapsulant 301 are removed with, e.g., a dry etch process. However, any other suitable method for patterning the encapsulant 301 may be utilized.

FIG. 7B illustrates a top down view of the first semiconductor die 201, the second semiconductor die 203, and the encapsulant 301 with four of the first openings 701 formed within the encapsulant 301. In this embodiment the first openings 701 are located between corners of the encapsulant 301 and corresponding corners of the first semiconductor die 201 and the second semiconductor die 203. By locating the first openings 701 within adjacent to corner regions of the encapsulant 301, the first openings 701 can be used to help relieve stress that can build up along the corners.

FIG. 7C illustrates a close up view of one of the first openings 701 in the dashed box 707 in FIG. 7B. As can be seen, in an embodiment the first opening 701 is located within a first opening region (represented in FIG. 7C be the dashed box labeled 703), wherein the first opening region 703 is in the shape of an "L." As such, a first side of the first opening region 703 extends along a first side of the second semiconductor die 203 while a second side of the first opening region 703 extends along a second side of the second semiconductor die 203.

As such, in an embodiment in which the encapsulant 301 may have a first width $W_1$ of between about 0.4 mm and about 1.2 mm alongside a first side of the second semiconductor die 203 and a first length $L_1$ of between about 0.4 mm and about 1.2 mm alongside a second side of the second semiconductor die 203, the first opening region 703 may be located a first distance $D_1$ of between about 50 μm and about 200 μm from the second semiconductor die 203. Additionally, the first opening region 703 may be located a second distance $D_2$ of between about 50 μm and about 200 μm from the edge of the encapsulant 301. However, any suitable dimensions may be utilized.

Additionally, the first opening region 703 may have dimensions that are suitable for reducing or elimination stresses at the corner during subsequent manufacturing, testing (e.g., during cooling thermal loads applied during reliability tests), or operation. For example, in one embodiment the first opening region 703 may have an area of between about 3% and about 10% of the total top surface of the encapsulant 301, and may have a second width $W_2$ of greater than or equal to about 0.3 mm and less than about 1 mm, and may also have a second length $L_2$ of between about 0.15 mm and about 0.8 mm. Further, the first opening region 703 may have a third width $W_3$ of between about 0.15 mm and about 0.8 mm and a third length $L_3$ of greater than or equal to about 0.3 mm. Finally, a ratio of the second length $L_2$ to the third width $W_3$ may be equal to a ratio of the first width $W_1$ and the first length minus twice the first distance $D_1$. However, any suitable dimensions may be utilized.

Within the first opening region 703, the first opening 701 may be arranged in order to help reduce or eliminate the occurrence of cracks. As can be seen, in this embodiment the first opening 701 may be shaped as an sharp "C" shape, wherein the first opening 701 has multiple points of contact with the edges of the first opening region 703. Additionally, the first openings 701 may be formed to a third height $H_3$ within the encapsulant 301 of between about 0.2 mm and about 0.15 mm less than the second height $H_2$. However, any suitable and depth may be used.

By adding the first openings 701 as molding cut structures, the overall amount of stress can be reduced or even eliminated. Such an effective reduction in molding stress helps to prevent or eliminate molding cracks that can occur at the corners. This helps to ensure better corner reliability at the corners, which becomes a larger issue for super large organic interposers (e.g., when the organic interposer is two times as large as the reticle used to image the organic interposer). Such reductions in cracks help to improve yield and performance of the device being manufactured.

Figure 8:
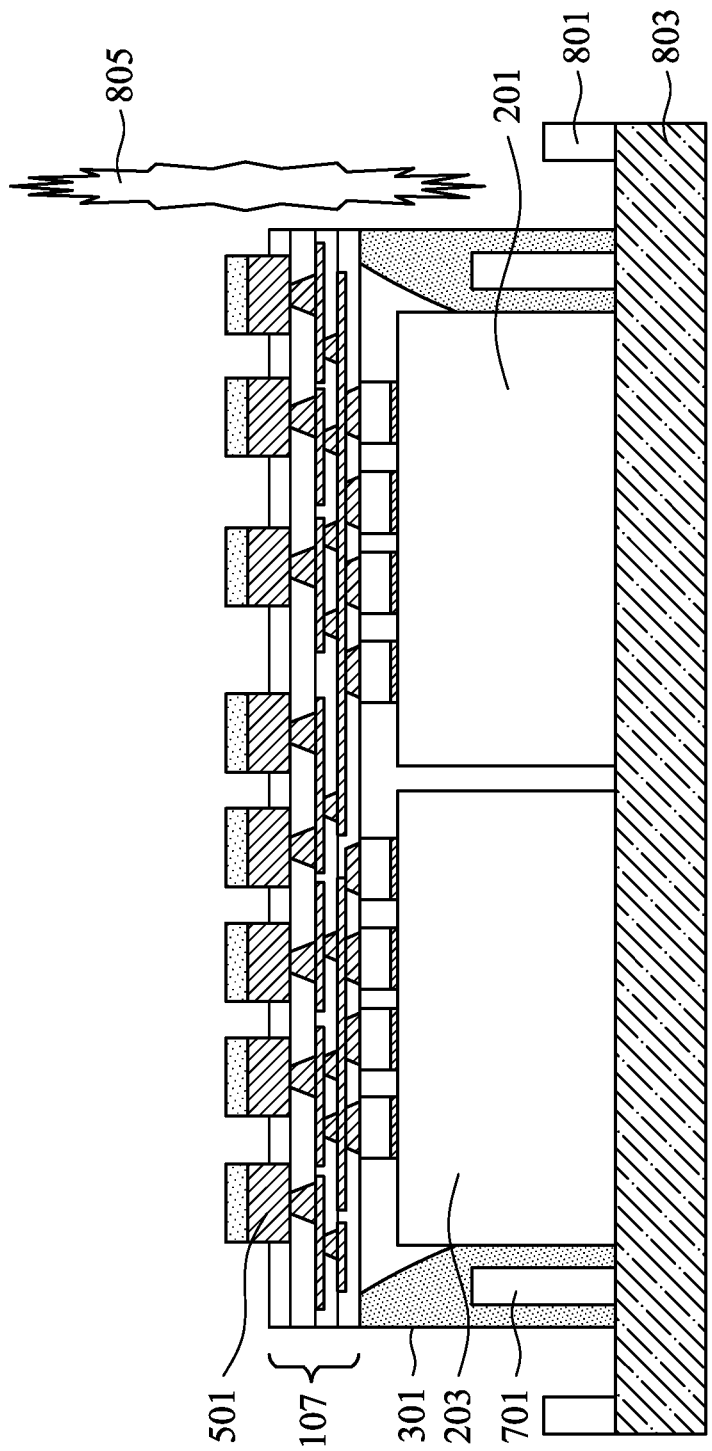
FIG. 8 illustrates a singulation process, in accordance with some embodiments.

FIG. 8 illustrates that, once the first opening 701 has been formed within the first opening region 703, the structure may be singulated from other structures (not separately illustrated). In an embodiment the first semiconductor die 201 and the second semiconductor die 203 may first be attached to a second ring structure 801. The second ring structure 801 may be a metal ring intended to provide support and stability for the structure during and after the singulation process. In an embodiment the first semiconductor die 201 and the second semiconductor die 203 are attached to the second ring structure 801 using, e.g., an ultraviolet tape 803, although any other suitable adhesive or attachment may alternatively be used.

Once attached to the second ring structure 801, the first semiconductor die 201 and the second semiconductor die 203 are singulated using one or more saw blades (represented in FIG. 8 by the saw blade labeled 805) to separate the first semiconductor die 201 and the second semiconductor die 203 from other structures (not separately illustrated). However, any suitable method of singulation, including laser ablation or one or more wet etches, may also be utilized.

Figure 9:
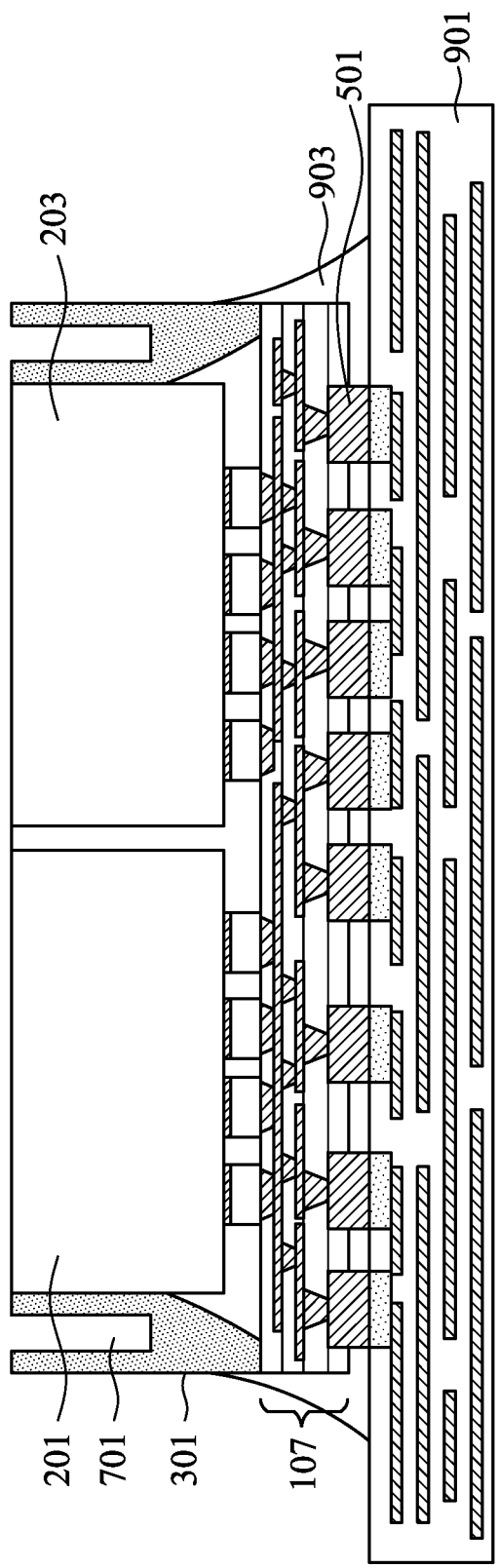
FIG. 9 illustrates bonding of the structure to a package substrate, in accordance with some embodiments.

FIG. 9 illustrates that, once the structure has been singulated, the second conductive connectors 501 are bonded to a package substrate 901. In some embodiments, the package substrate 901 is a laminate package substrate, wherein conductive traces are embedded in laminate dielectric layers. In other embodiments, the package substrate 901 is a built-up package substrate, which comprises cores (not shown), and conductive traces built on opposite sides of the cores. The cores of built-up package substrates include a fiber layer (not shown) and metallic features (not shown) penetrating through the fiber layer, with the conductive traces interconnected through the metallic features. Specific examples of materials that may be used as the cores include a fiberglass resin such as FR4, bismaleimide-triazine BT resin, other PCB materials or films, build up films such as ABF or other laminates. The conductive traces are interconnected through conductive features in the cores.

In an embodiment the second conductive connectors 501 may be bonded by initially aligning the second conductive connectors 501 with conductive structures of the package substrate 901. Once aligned and in contact, and in embodiments in which the second conductive connectors 501 are C4 connectors, the second conductive connectors 501 are then reflowed in order to bond the second conductive connectors 501 to the package substrate 901. However, any suitable bonding process may be utilized.

Additionally, once the second conductive connectors 501 have been bonded, a second underfill 903 may be placed between the first redistribution structure 107 and the package substrate 901. In an embodiment the second underfill 903 is a protective material used to cushion and support the package substrate 901, the second conductive connectors 501, and the first redistribution structure 107 from operational and environmental degradation, such as stresses caused by the generation of heat during operation. The second underfill 903 may be placed using an injection process with capillary action or may be otherwise formed in the space between the first redistribution structure 107 and the package substrate 901 and may, for example, comprise a liquid epoxy that is dispensed between the first redistribution structure 107 and the package substrate 901 and then cured to harden.

By adding the first openings 701 into the encapsulant 301, the stresses that the manufacturing process produces can be reduced and/or eliminated. This reduction in the stresses further reduces or eliminates cracks that can occur at the corners of the encapsulant 301. This helps to ensure fewer cracks at the corners, which helps to improve overall yield and performance of the device being manufactured.

Figure 10:
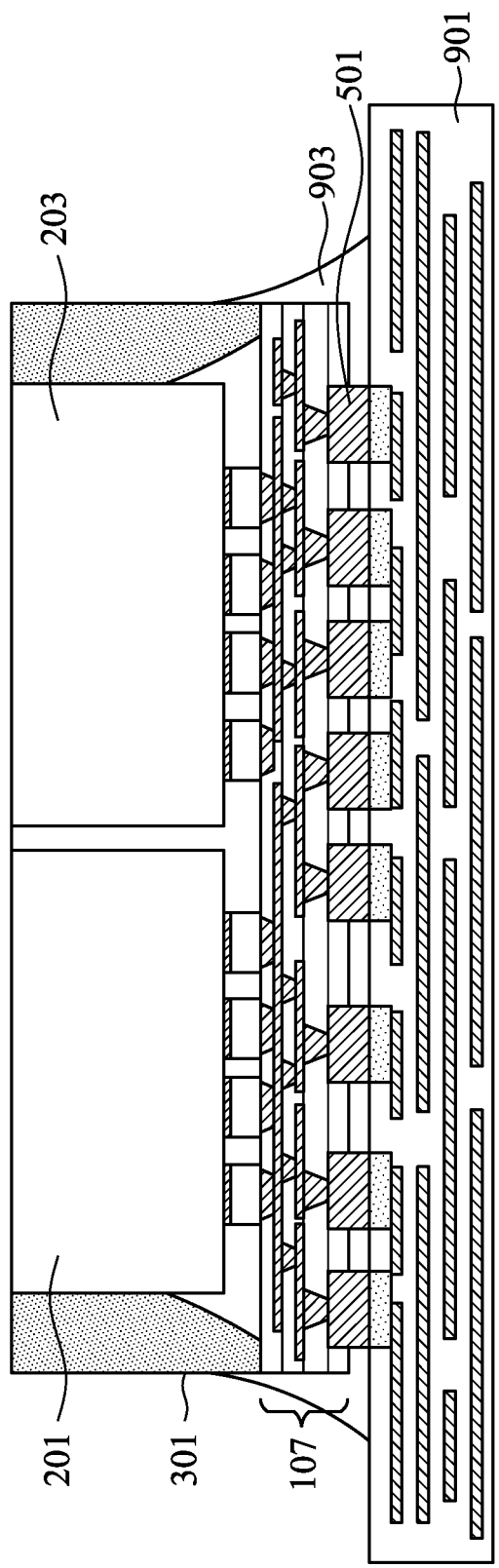
FIGS. 10-11 illustrate formation of the first openings after bonding to the package substrate, in accordance with some embodiments.
Figure 11:
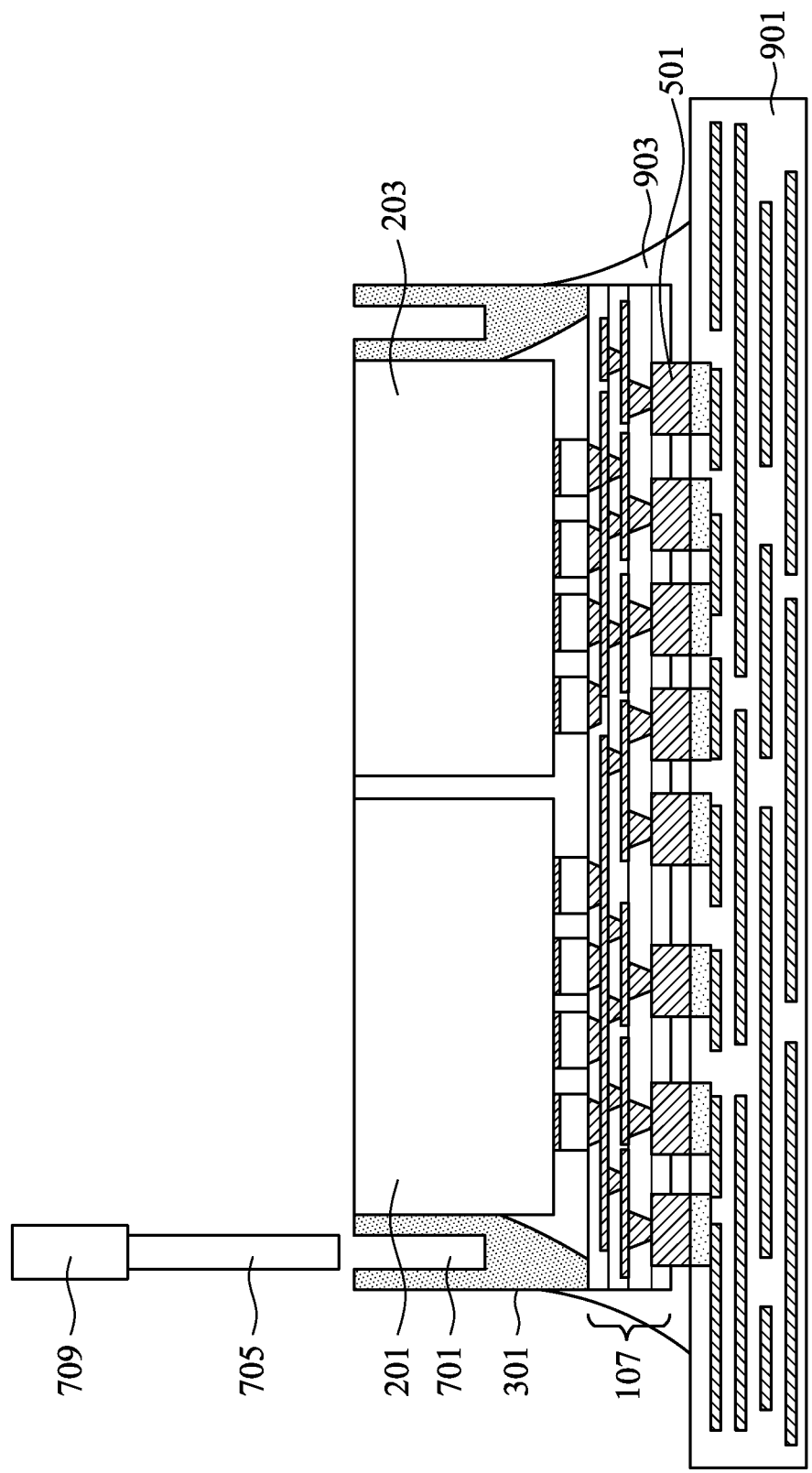

FIGS. 10-11 illustrate another embodiment in which the manufacturing process, instead of forming the first openings 701 immediately following the thinning of the encapsulant 301 (as described above with respect to FIGS. 7A-7C), the forming of the first openings 701 waits until after the second conductive connectors 501 have been bonded to the package substrate 901 and the second underfill 903 has been dispensed. In this embodiment the process proceeds as described above with respect to FIGS. 1-9, except the formation of the first openings 701 is omitted. As such, as illustrated in FIG. 10, the first semiconductor die 201 and the second semiconductor die 203 are connected to the package substrate 901 while the first semiconductor die 201 and the second semiconductor die 203 are surrounded by the encapsulant 301 without the presence of the first openings 701.

FIG. 11 illustrates that, once the first semiconductor die 201 and the second semiconductor die 203 have been bonded to the package substrate 901, the first openings 701 may be formed within the encapsulant 301. For example, the first openings 701 may be formed as described above with respect to FIGS. 7A-7C, such as by using a laser 709 to generate a laser beam 705 and directing the laser beam 705 at the encapsulant 301. However, any suitable method of forming the first openings 701 may be utilized.

By waiting until after the second underfill 903 has been placed, the second underfill 903 is in place in order to protect the structures during the formation of the first opening 701. In particular, the second underfill 903 adds another layer of protection during the exposure of the encapsulant 301 to the laser beam 705. Additionally, the formation of the first openings 701 may be performed at any desired point during the manufacturing process, thereby expanding the manufacturing flexibility, and allowing for a robust manufacturing process.

Figure 12:
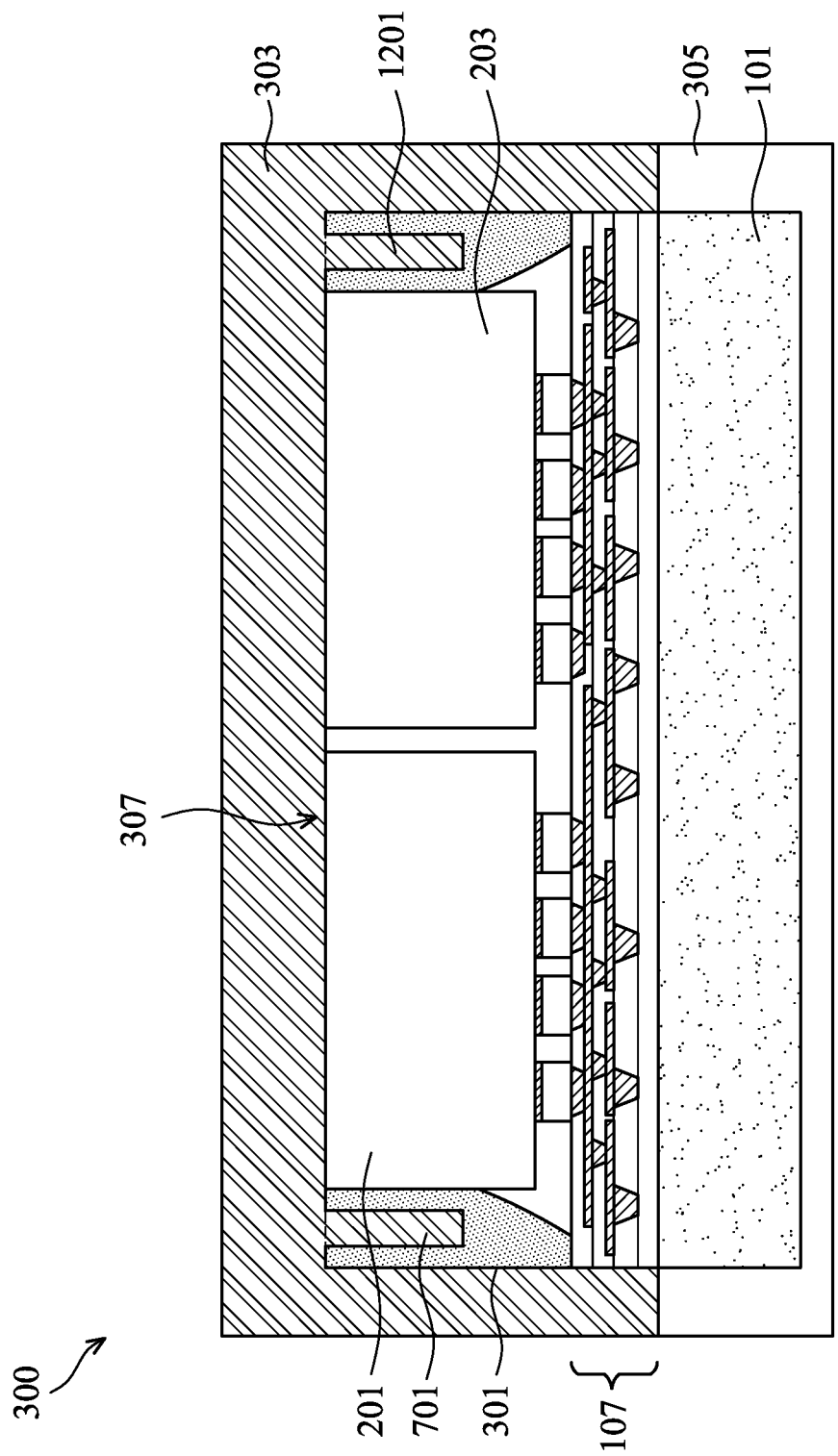
FIGS. 12-13 illustrate a formation of the first openings with extensions, in accordance with some embodiments.
Figure 13:
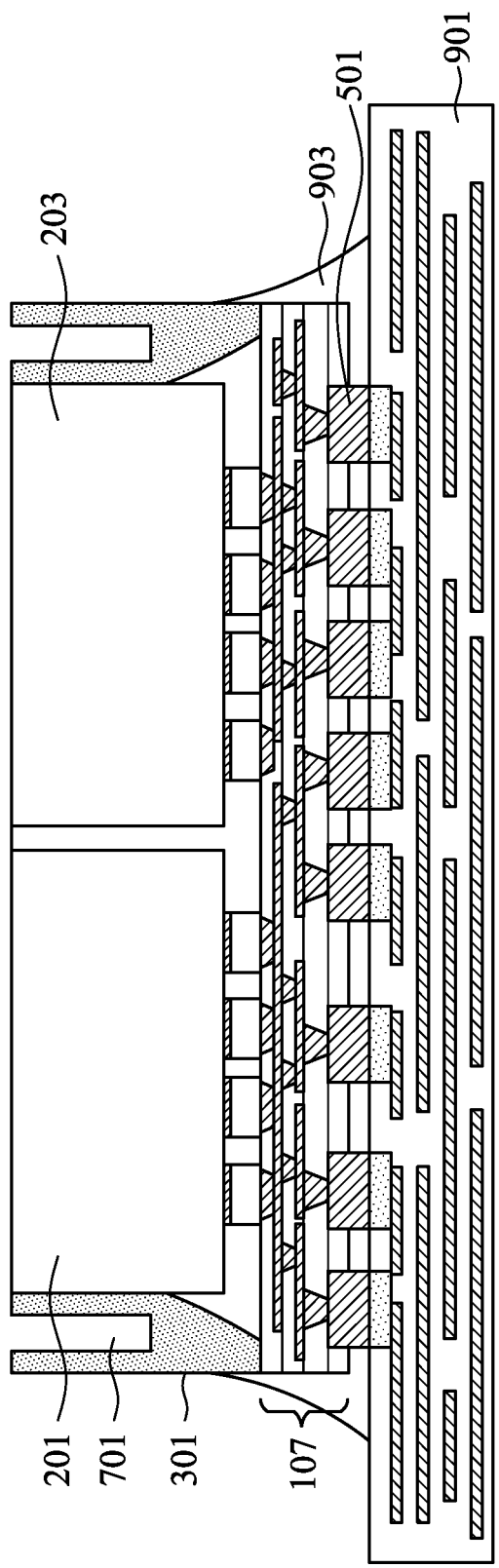

FIGS. 12-13 illustrate yet another embodiment in which the formation of the first openings 701 after the thinning of the encapsulant 301 is omitted and the first openings 701 are formed at a different point in the manufacturing process. In this embodiment the process begins as described above with respect to FIGS. 1-2, in which the first redistribution structure 107 is formed and then the first semiconductor die 201 and the second semiconductor die 203 are bonded to the first redistribution structure 107.

In this embodiment, however, when the first semiconductor die 201 and the second semiconductor die 203 are placed within the molding cavity 307, the first openings 701 are formed by adding extensions 1201 (illustrated as being separate from the top molding portion 303 by the dashed lines) to the top molding portion 303. In an embodiment the extensions 1201 may be either formed with or added to the top molding portion 303 and may have similar lengths, widths, and shapes of the desired first openings 701. For example, the extensions 1201 may have the first height $H_1$ and are shaped in the desired shape of the first openings 701.

Once the extensions 1201 are present (either on or else as part of the top molding portion 303), the first semiconductor die 201 and the second semiconductor die 203 are placed within the molding cavity 307, and the top molding portion 303 and the bottom molding portion 305 are brought together. Once brought together, the encapsulant 301 may be injected or otherwise added to the molding cavity 307 to encapsulate the first semiconductor die 201 and the second semiconductor die 203.

However, because of the presence of the extensions 1201 in the shape of the desired first openings 701, as the encapsulant 301 enters the molding cavity 307, the encapsulant 301 is not able to fill the area that is taken up by the extensions 1201. As such, the encapsulant 301 will take on the shape of the extensions 1201. Accordingly, when the top molding portion 303 is separated from the bottom molding portion 305 to remove the first semiconductor die 201 and the second semiconductor die 203, the extensions 1201 will also be removed from the encapsulant 301, thereby leaving behind the first openings 701 at this stage in the process.

FIG. 13 illustrates that, once the encapsulant 301 with the first openings 701 has been formed using the top molding portion 303, the process may continue as described above with respect to FIGS. 4-9 (without performing the formation of the first openings 701 as described above with respect to FIGS. 7A-7C). In particular, the second conductive connectors 501 are formed, the encapsulant 301 (along with the first openings 701) is thinned, and the second conductive connectors 501 are bonded to the package substrate 901. However, any suitable methods may be utilized.

By incorporating the extensions 1201 into the top molding portion 303, the first openings 701 may be formed during the introduction of the encapsulant 301. As such, the first openings 701 are formed in the same step as the placement of the encapsulant 301, thereby rendering subsequent and separate steps of formation redundant and unnecessary. As such, the benefits of the first openings 701 may be achieved without the need for additional steps in the manufacturing process.

Figure 14:
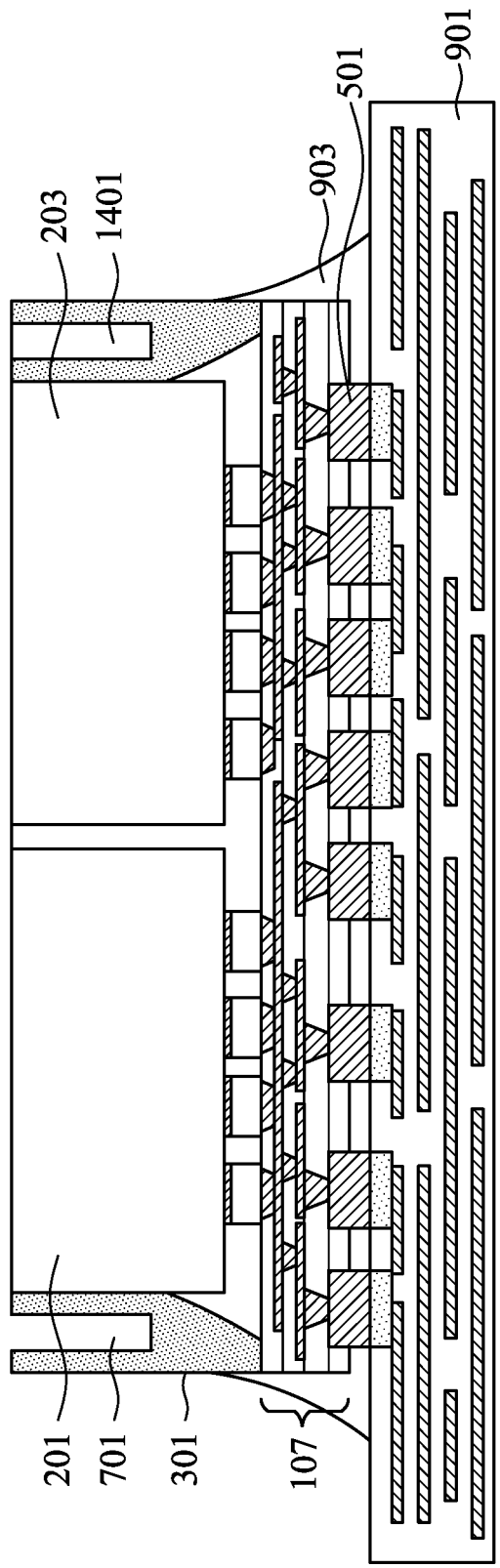
FIG. 14 illustrates a filling of the first openings, in accordance with some embodiments.

FIG. 14 illustrates yet another embodiment in which, instead of leaving the first openings 701 free from any solid or liquid materials (as illustrated above with respect to the embodiments discussed in FIGS. 1-13), the first openings 701 are instead filled with a first material 1401 which helps to further reduce or eliminate the stresses along the corners. In an embodiment the first material 1401 may be a material that is softer than the encapsulant 301, such as by having a Young's modulus of between about 2 GPa and about 10 GPa, such as an epoxy or polymer material. In an embodiment in which the first material 1401 is an epoxy, the first material 1401 may be placed into the first openings 701 through an injection process, a dispensing process, or a coating process. However, any suitable material and any suitable process may be utilized.

In some embodiments the first material 1401 may be added to the first openings 701 in order to partially fill, fill and/or overfill the first openings 701. In embodiments in which the first material 1401 overfills the first openings 701, a planarization process such as a chemical mechanical polish or etchback process, may be utilized to planarize the first material 1401 with the encapsulant 301. However, any suitable process may be utilized.

By adding the first material 1401 into the first openings 701, a precise amount of strength (e.g., for support) and softness (for stress reduction) can be applied. As such, the amount of stresses allowed within the encapsulant 301 can be precisely controlled. Accordingly, the additional material may provide additional strength while still obtaining the benefits of stress reduction.

FIGS. 15A-15E illustrate further embodiments in which the first openings 701 (filled or unfilled with the first material 1401) are formed in different shapes OTHER than the sharp "C" shape illustrated and described above with respect to FIGS. 7A-7C. Looking first at FIG. 15A, in this embodiment the first openings 701, instead of having a sharp "C" shape in which right angles are utilized to connect different portions of the first openings 701, are formed in a "C" shape wherein the first openings 701 have curved shapes. Such curved shapes helps to further prevent stresses from building up along sharp edges.

Figure 15C:
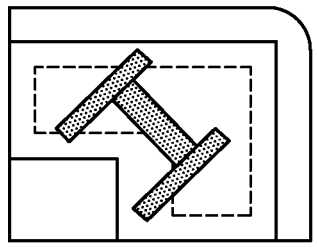
FIGS. 15A-15E illustrate different shapes for the first openings, in accordance with some embodiments.
Figure 15B:
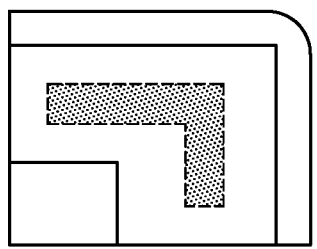
Figure 15A:
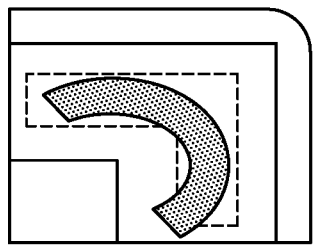

Looking next at FIG. 15B, therein is illustrated yet another embodiment of the first openings 701. In this embodiment, however, the first openings 701 are formed in an "L" shape which fills up the entire first opening region 703. For example, the first openings 701 may be formed with two straight portions, and the two straight portions intersect each other at a right angle. In this embodiment the two straight portions may either be the same length or else may be different lengths from each other. However, any suitable dimensions may be utilized.

Looking next at FIG. 15C, in this embodiment, the first openings 701 are formed in an "H" shape. For example, the first openings 701 may have two straight portions separated from each other by a distance. Further, a third straight portion may extend between the two straight portions at a mid point of the two straight portions. However, any suitable dimensions, and any suitable location for the third straight portion may be utilized.

Figure 15E:
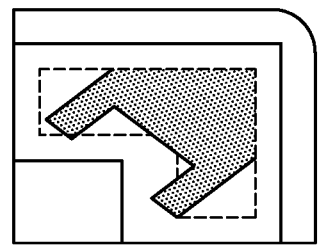
Figure 15D:
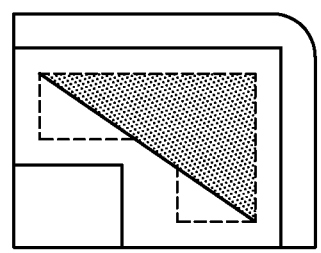

Looking at FIG. 15D, in this embodiment the first openings 701 are formed as a solitary, single shape. For example, in this illustrated embodiment the first openings 701 are formed as a triangle shape. However, any other suitable shape, such as a square shape, a circle shape, or the like, may be utilized.

Finally, looking at FIG. 15E, in this embodiment the first openings 701 are formed as a combination of the other previously described shapes. For example, as illustrated, the first openings 701 may comprise a combination of the "H" shape (illustrated above with respect to FIG. 15C) and the triangle shape (illustrated above with respect to FIG. 15D). However, any suitable shape may be utilized.

By utilizing the first openings 701 (either filled or unfilled) in any of the desired shapes, the amount of stress that occurs along corners of the encapsulant 301 can be reduced. By reducing the stress along the corners of the encapsulant 301, cracks that would otherwise form along the corners can be reduced. Such a reduction helps to increase the overall yield of the manufacturing process.

In accordance with an embodiment, a method of manufacturing a semiconductor device, the method includes: forming a redistribution structure; attaching a first semiconductor die to the redistribution structure; and encapsulating the first semiconductor die with an encapsulant, wherein after the encapsulating the first semiconductor die the encapsulant has a first opening extending into the encapsulant a first distance from a first surface, the first distance being less than a height of the encapsulant, the first surface being planar with the first semiconductor die, a bottom surface of the first opening being the encapsulant. In an embodiment the method further includes bonding the redistribution structure to a package substrate. In an embodiment the encapsulating the first semiconductor die further includes: applying the encapsulant around the first semiconductor die; and forming the first opening after the applying the encapsulant has been completed. In an embodiment the forming the first opening comprises directing a laser beam at the encapsulant. In an embodiment the method further includes thinning the encapsulant prior to the forming the first opening. In an embodiment the first opening has a "C" shape. In an embodiment the encapsulating the first semiconductor die with the encapsulant comprises placing the encapsulant around a first extension, the first extension in a shape of the first opening.

In accordance with another embodiment, a method of manufacturing a semiconductor device, the method includes: bonding a first semiconductor die to a first redistribution layer; bonding a second semiconductor die to the first redistribution layer; encapsulating the first semiconductor die and the second semiconductor die with an encapsulant; and forming a plurality of openings along respective corners of the encapsulant, wherein each wall of the plurality of openings is the encapsulant. In an embodiment the method further includes at least partially filling at least one of the plurality of the openings with a first material. In an embodiment the first material is softer than the encapsulant. In an embodiment the forming the plurality of openings is performed at least in part by irradiating the encapsulant with a laser. In an embodiment the irradiating the encapsulant is performed after a thinning of the encapsulant. In an embodiment the irradiating the encapsulant occurs after the first redistribution layer is bonded to a package substrate. In an embodiment at least one of the plurality of openings has an "H" shape.

In accordance with yet another embodiment, a semiconductor device includes: a redistribution structure; a first semiconductor die bonded to the redistribution structure; a second semiconductor die bonded to the redistribution structure; an encapsulant surrounding the first semiconductor die and the second semiconductor die, the encapsulant having a first surface that is coplanar with the first semiconductor die and the second semiconductor die; and a first opening extending partially into the encapsulant from the first surface, the first opening being located between the first semiconductor die and a sidewall of the encapsulant. In an embodiment the first opening is filled with a first material, the first material being softer than the encapsulant. In an embodiment the first opening is in a shape of a "C." In an embodiment the first opening is in a shape of a "H." In an embodiment the first opening is in a shape of a triangle. In an embodiment the semiconductor device further includes a package substrate bonded to the redistribution structure, a bottom of the first opening being the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a redistribution structure;
a first semiconductor die attached to the redistribution structure; and an encapsulant encapsulating the first semiconductor die; and a first opening extending into the encapsulant a first distance from a first surface, the first distance being less than a height of the encapsulant, the first surface being planar with the first semiconductor die, a bottom surface of the first opening being the encapsulant, wherein the first opening has a "C" shape.

2. The semiconductor device of claim 1, further comprising a package substrate bonded to the redistribution structure.

3. The semiconductor device of claim 1, further comprising a second semiconductor die attached to the redistribution structure.

4. The semiconductor device of claim 1, wherein the encapsulant extends away from the first semiconductor die a first distance of between about 0.4 mm and about 1.2 mm.

5. The semiconductor device of claim 4, wherein the first opening is separated from an edge of the encapsulant by a second distance of between about 50 µm and about 200 µm.

6. The semiconductor device of claim 1, further comprising a first material at least partially filling the first opening.

7. The semiconductor device of claim 6, wherein the first material is softer than the encapsulant.

8. A semiconductor device comprising:
   a first semiconductor die bonded to a first redistribution layer;
   a second semiconductor die bonded to the first redistribution layer;
   an encapsulant encapsulating the first semiconductor die and the second semiconductor die, wherein a plurality of openings are located along respective corners of the encapsulant, wherein each wall of the plurality of openings is the encapsulant; and
   a first material at least partially filling at least one of the plurality of openings.

9. The semiconductor device of claim 8, wherein at least one of the plurality of openings has an "H" shape.

10. The semiconductor device of claim 8, wherein at least one of the plurality of openings has a "C" shape.

11. The semiconductor device of claim 8, wherein at least one of the plurality of openings has an "L" shape.

12. The semiconductor device of claim 8, wherein at least one of the plurality of openings has a combination of an "H" shape and a triangle shape.

13. The semiconductor device of claim 8, wherein the first material is softer than the encapsulant.

14. The semiconductor device of claim 8, wherein at least one of the plurality of openings has a triangular shape.

15. A semiconductor device comprising:
   a redistribution structure;
   a first semiconductor die bonded to the redistribution structure;
   a second semiconductor die bonded to the redistribution structure;
   an encapsulant surrounding the first semiconductor die and the second semiconductor die, the encapsulant having a first surface that is coplanar with the first semiconductor die and the second semiconductor die; and
   a first opening extending partially into the encapsulant from the first surface, the first opening being located between the first semiconductor die and a sidewall of the encapsulant, a bottom of the first opening being the encapsulant, wherein the first opening is filled with a first material, the first material being softer than the encapsulant.

16. The semiconductor device of claim 15, wherein the first opening is in a shape of a "C".

17. The semiconductor device of claim 15, wherein the first opening is in a shape of a "H".

18. The semiconductor device of claim 15, wherein the first opening is in a shape of a triangle.

19. The semiconductor device of claim 15, further comprising a package substrate bonded to the redistribution structure.

20. The semiconductor device of claim 15, wherein the first material is an epoxy.

* * * * *